(12) United States Patent
Deguchi et al.

(10) Patent No.: US 7,724,478 B2
(45) Date of Patent: May 25, 2010

(54) MAGNETIC DISK DRIVE, WIRING CONNECTION STRUCTURE AND TERMINAL STRUCTURE

(75) Inventors: Takaaki Deguchi, Kanagawa (JP);
Toshiyuki Katoh, Kanagawa (JP);
Katsumi Kiguchi, Kanagawa (JP);
Nobuo Sasaoka, Kanagawa (JP);
Kohichi Suzuki, Kanagawa (JP); Shingo Tsuda, Kanagawa (JP)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 0 days.

(21) Appl. No.: 12/079,700

(22) Filed: Mar. 27, 2008

(65) Prior Publication Data

US 2008/0239578 A1 Oct. 2, 2008

Related U.S. Application Data

(62) Division of application No. 11/200,865, filed on Aug. 9, 2005, now Pat. No. 7,372,669.

(30) Foreign Application Priority Data

Aug. 9, 2004 (JP) ............................. 2004-231948

(51) Int. Cl.
*G11B 5/60* (2006.01)
*G11B 21/21* (2006.01)

(52) U.S. Cl. ................................. 360/245.9; 360/264.2

(58) Field of Classification Search ............. 360/245.9, 360/264.2; 174/250, 254, 255, 268; 439/67, 439/77, 493; 361/776
See application file for complete search history.

(56) References Cited

U.S. PATENT DOCUMENTS

| | | | | |
|---|---|---|---|---|
| 5,009,605 A | * | 4/1991 | Crumly et al. | 439/67 |
| 5,121,273 A | * | 6/1992 | Slezak | 360/264.2 |
| 5,805,377 A | * | 9/1998 | Lerdal et al. | 360/97.01 |
| 5,982,626 A | * | 11/1999 | Kodama | 361/749 |
| 6,098,271 A | * | 8/2000 | Yamamoto et al. | 29/603.06 |

* cited by examiner

*Primary Examiner*—William J Klimowicz
(74) *Attorney, Agent, or Firm*—Townsend and Townsend and Crew LLP; John Henkhaus

(57) ABSTRACT

Terminals of a flexible printed circuit board and terminals of a wiring trace in a head suspension assembly are to be connected with each other by soldering without causing a soldering defect. In an embodiment, a terminal structure of a multi-connector in a wiring trace which includes an insulating layer and a conductor pattern portion formed on a surface of the insulating layer is provided with exposed portions of terminals exposed from apertures formed in part of the insulating layer and is also provided with lining portions adjacent to the exposed portions in a longitudinal direction of the conductor pattern portion and bonded to the insulating layer. Even if terminals of the multi-connector are cracked when soldered, not only conductivity is ensured, but also it is possible to strengthen the terminals, because the lining portions of the terminals are bonded to the insulating layer.

15 Claims, 8 Drawing Sheets

(A)

(B)

(A)

(B)

MAGNETIC DISK DRIVE, WIRING CONNECTION STRUCTURE AND TERMINAL STRUCTURE

CROSS-REFERENCES TO RELATED APPLICATIONS

This application claims priority from Japanese Patent Application No. JP2004-231948, filed Aug. 9, 2004, the full disclosure of which is incorporated herein by reference.

BACKGROUND OF THE INVENTION

The present invention relates to a magnetic disk drive, as well as a wiring connection structure and a terminal structure in the magnetic disk drive. Particularly, the present invention is concerned with a terminal structure and a wiring connection structure both able to attain a stable electric connection between terminals of a flexible printed circuit board and terminals of a wiring trace in a head suspension assembly, as well as a magnetic disk drive using those terminal structure and wiring connection structure.

With the recent tendency to the reduction in size of hard disk drives, the design and manufacture of various portions of a suspension for moving a magnetic head are becoming more and more difficult. In particular, the work for electrically connecting terminals of a flexible printed circuit board connected to an electronic part which is for controlling the operation of a magnetic disk drive and data transfer and terminals of a wiring trace in a head suspension assembly is now an important process which dominates product yield and reliability. Two types of methods are mainly adopted for the electric connection. According to the first method, the terminals of the flexible printed circuit board and the terminals of the wiring trace in the head suspension assembly are connected together somewhat apart through a solder bridge. According to the second method, both terminals are connected together in a contacted or sufficiently approached state by soldering or by ultrasonic bonding.

For mass production in accordance with the first method it is necessary to use an apparatus for melting and solidifying solder in a bridge shape. In case of adopting the second method, it is possible to effect mass production even by manual operation.

FIG. 7 is a plan view showing a multi-connector provided at one end of a wiring trace, in which (A) is a plan view of a soldering iron contacting side and (B) is a plan view of a side for contact with a flexible printed circuit board. A wiring trace 500 used in the second method comprises an insulating layer 502, four conductor patterns 503a, 503b, 503c, and 503d, and a cover layer 504. The four conductor patterns are arranged side by side on a surface of the insulating layer 502. The cover layer 504 is formed on surfaces of the conductor patterns 503a, 503b, 503c, 503d and the surface of the insulating layer 502 so as to cover the conductor patterns 503a, 503b, 503c, and 503d. The wiring trace 500 is provided at one end thereof with a multi-connector 501. The multi-connector 501 is provided with four terminals 505a, 505b, 505c, and 505d at equal intervals in a longitudinal direction of the conductor patterns 503a, 503b, 503c, and 503d. The terminals 505a, 505b, 505c, and 505d are portions of the conductor patterns 503a, 503b, 503c, and 503d, respectively, and are formed as somewhat wide patterns at front ends of the conductor patterns. In the insulating layer 502 of the multi-connector 501 is formed a single rectangular aperture 506 so that the four terminals 505a, 505b, 505c, and 505d are partially exposed from the aperture. A cover layer 504a of the multi-connector 501 is formed separately from the cover layer 504 of the wiring trace 500. In the cover layer 504a, as is the case with the insulating layer 502 of the multi-connector 501, a single rectangular aperture 507 is formed in the cover layer 504a so that the four terminals 505a, 505b, 505c, and 505d are partially exposed from the aperture.

FIG. 8 is an explanatory diagram showing a connection structure in which the terminals 505a, 505b, 505c, and 505d of the multi-connector 501 are soldered onto terminals 602a, 602b, 602c, and 602d of a flexible printed circuit board 600. The terminals 602a, 602b, 602c, and 602d are provided on end sides of conductor patterns 601a, 601b, 601c, and 601d serving as four lead wires. The multi-connector 501 is bent from the wiring trace 500 so that the aperture 506 of the insulating layer 502 (see FIG. 7) faces up, and is placed on the flexible printed circuit board 600. In FIG. 8, for convenience' sake, the conductor patterns 601a, 601b, 601c, and 601d of the flexible printed circuit board 600 are represented by solid lines except the portion covered with the multi-connector 501.

The terminals 505a, 505b, 505c, and 505d of the multi-connector 501 thus placed on the flexible printed circuit board 600 are aligned onto the terminals 602a, 602b, 602c, and 602d of the same printed circuit board and are then heated with a soldering iron. As the terminals 505a, 505b, 505c, and 505d are heated with the soldering iron, solder bumps formed on the terminals 602a, 602b, 602c, and 602d melt, so that the terminals 505a, 505b, 505c, 505d and the terminals 602a, 602b, 602c, 602d, which are exposed from the aperture 506 of the insulating layer 502, are connected together by solder 508 so as to be covered substantially throughout the whole surface. All that is required for this soldering work is a mere fixing of the head suspension assembly to a jig. Thus, mass production can be effected even by manual operation, and therefore the device cost can be kept to a minimum.

BRIEF SUMMARY OF THE INVENTION

In the conventional wiring integrated type suspension referred to above in connection with the prior art, at the time of connecting the terminals 602a, 602b, 602c, 602d of the flexible printed circuit board 600 with the terminals 505a, 505b, 505c, 505d of the multi-connector 501 by soldering, the terminals 505a, 505b, 505c, and 505d of the multi-connector 501 are in an uncovered state (flying leads) over the space within the aperture 506 formed in the insulating layer 502 and also over the space within the aperture 507 formed in the cover layer 504. While soldering is performed from above the terminals of the multi-connector 501 with a soldering iron in such a state, if the terminals are subjected to aligning with the soldering iron or if they are displaced by mistake during the period after soldering the first terminal until soldering the next terminal, an edge portion of the aperture 506 in the insulating layer or of the aperture 507 in the cover layer may be cracked because the terminals of the multi-connector 501 are very thin (e.g., 0.012 mm), resulting in the entire suspension becoming defective.

Usually, solder bumps are formed on the terminals 602a, 602b, 602c, and 602d of the flexible printed circuit board 600, then the terminals 505a, 505b, 505c, and 505d of the multi-connector 501 are aligned onto the solder bumps. The terminals 505a, 505b, 505c, and 505d of the multi-connector 501 are heated with a soldering iron to melt the solder bumps and effect soldering thereby. In the connection structure shown in FIG. 8, however, with only the solder 508 formed by melting the solder bumps, there sometimes occurs a case where the strength is low. This is because the terminals of the multi-connector 501 are in an uncovered state (flying leads) over the space within the aperture 506 formed in the insulating layer 502 and also over the space within the aperture 507 formed in the cover layer 504a. In this case, since soldering is performed so as to cover the whole of the terminals of the multi-connector 501 from above the terminals with solder, not only is it necessary to use solder other than the solder bumps, but also flux caused by contamination increases.

The present invention has been accomplished for solving the above-mentioned conventional problems. It is a feature of the present invention to provide a highly reliable terminal structure and wiring connection structure able to improve productivity. It is another feature of the present invention to prevent cracking of terminals of a wiring trace in a head suspension assembly at the time of connecting terminals of a flexible printed circuit board with the terminals of the wiring trace and also prevent the addition of solder. It is yet another feature of the present invention to provide a magnetic disk drive using those terminal structure and wiring connection structure.

In a first aspect of the present invention there is provided a terminal structure formed in a wiring trace including an insulating layer and a conductor pattern formed on a surface of the insulating layer. The conductor pattern comprises an exposed portion exposed from an aperture formed in part of the insulating layer and a lining portion adjacent to the exposed portion in a longitudinal direction of the conductor pattern and bonded to the insulating layer.

In a second aspect of the present invention there is provided a wiring connection structure connecting a flexible printed circuit board and a wiring trace with each other, the flexible printed circuit board including terminals, the wiring trace including an insulating layer and a conductor pattern formed on a surface of the insulating layer. The conductor pattern includes an exposed portion exposed from an aperture formed in part of the insulating layer and a lining portion bonded to the insulating layer in adjacency to the exposed portion in a longitudinal direction of the conductor pattern. The terminals of the flexible printed circuit board and the exposed portion of the conductor pattern are soldered to each other.

In a third aspect of the present invention there is provided a magnetic disk drive comprising a magnetic disk, a head for reading data from the magnetic disk, and an actuator head suspension assembly with the head attached thereto. Further the magnetic disk drive comprises a wiring trace including an insulating layer and a conductor pattern formed on a surface of the insulating layer and connected to the head. The conductor pattern includes an exposed portion exposed from an aperture formed in part of the insulating layer and a lining portion adjacent to the exposed portion in a longitudinal direction of the conductor pattern and bonded to the insulating layer. The magnetic disk drive still further comprises a flexible printed circuit board connected to the wiring trace.

The present invention is an improved invention of a terminal structure and a wiring connection structure in connection with terminals formed in a wiring trace and connected to terminals of a flexible printed circuit board. A terminal formed in a conductor pattern of the wiring trace is provided with an exposed portion exposed from an aperture formed in part of an insulating layer and a lining portion adjacent to the exposed portion in a longitudinal direction of the conductor pattern and bonded to the insulating layer. According to this construction it is possible to form a highly reliable terminal structure. For example, at the time of heating the terminal of the wiring trace with a soldering iron in the conventional terminal structure, the terminal may be cracked if it is aligned with a terminal of a flexible printed circuit board or if it is displaced after soldering. In the terminal structure of the present invention, since the lining portion of the terminal is bonded to the insulating layer, the exposed portion is strengthened and difficult to be cracked. Even if the exposed portion should be cracked, there is no fear that the crack may reach the lining portion. Thus, the conductivity of the terminal is ensured. If a through aperture extending through an area of the insulating layer adjacent to the exposed portion in the longitudinal direction of the conductor pattern is formed in the aperture formed in part of the insulating layer, solder comes to connect a heating surface and a contact surface of the exposed portion with each other through the through aperture. Once the solder thus connects the heating surface and the contact surface of the exposed portion with each other through the through area of the insulating layer, the solder connection by the lapping of solder becomes stronger. The "lining portion adjacent to the exposed portion and bonded to the insulating layer" as referred to herein means that the exposed portion and the lining portion are in contact with each other adjacently and continuously.

In connection with the first aspect there is provided a terminal structure wherein the conductor pattern includes a first conductor pattern provided with the exposed portion and the lining portion and a second conductor pattern also provided with the exposed portion and the lining portion, and the portions of the insulating layer corresponding to the lining portion of the first conductor pattern and the lining portion of the second conductor pattern are connected together on an end side of the wiring trace rather than the lining portions.

The aspect just described above is concerned with conductor patterns having plural terminals, and since the portions of the insulating layer corresponding to the lining portions of the first and second conductor patterns are connected together at a foremost end portion of the wiring trace rather than the lining portions, the strength of the insulating layer may be enhanced around the aperture.

According to the present invention it is possible to provide a magnetic disk drive able to connect terminals of a flexible printed circuit board and terminals of a wiring trace in a head suspension assembly with each other by soldering without giving rise to any soldering defect, as well as a wiring connection structure and a terminal structure both used in the magnetic disk drive. According to the present invention, moreover, it is possible to provide a magnetic disk drive able to improve productivity and superior in soldering function, as well as a wiring connection structure and a terminal structure both used therein.

DETAILED DESCRIPTION OF THE INVENTION

Figure 1:
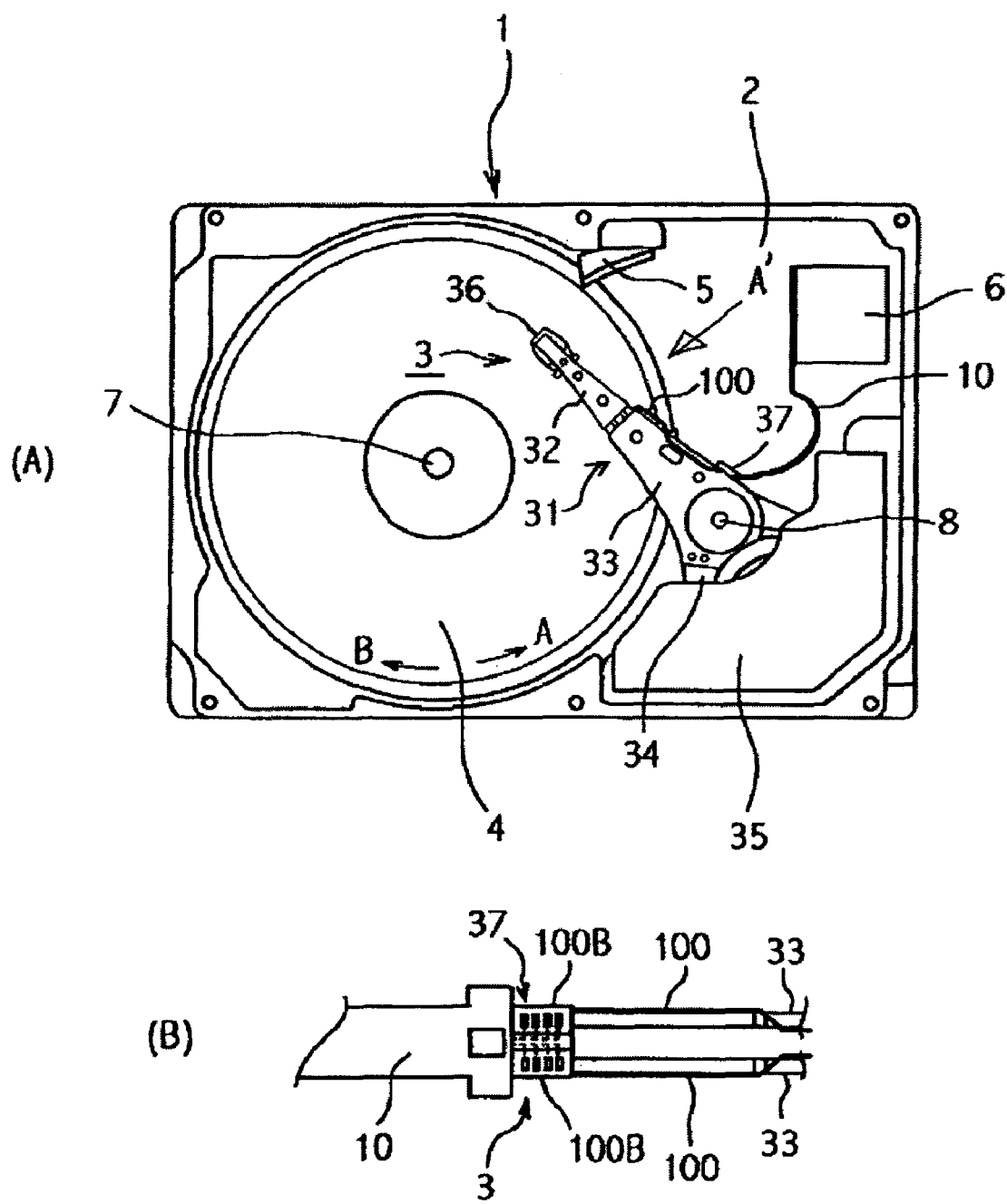
FIG. 1 shows a magnetic disk drive according to an embodiment of the present invention, in which (A) is a plan view and (B) is a side view of an actuator head suspension assembly.

Embodiments of the present invention will be described hereinunder with reference to the drawings. In all of the drawings, like numerals indicate like elements. FIG. 1 illustrates a magnetic disk drive 1 according to an embodiment of the present invention, in which (A) is a plan view showing a schematic construction of the magnetic disk drive and (B) is a partially enlarged side view of an actuator head suspension assembly as seen in the direction of arrow A' in (A). A base 2, together with a base cover (not shown), forms a hermetically sealed space. An actuator head suspension assembly 3, a magnetic disk 4, a ramp 5, and an external terminal 6 to be connected to a circuit board, are accommodated within the hermetically sealed space. The magnetic disk 4 is fixed to a spindle hub (not shown) so as to be rotated around a spindle shaft 7 by a spindle motor (not shown) disposed at a lower position. A magnetic layer is formed on at least one surface of the magnetic disk 4. Two or more magnetic disks 4 may be stacked. A rotational direction of arrow A of the magnetic disk 4 is designated a forward rotation, while a rotational direction of arrow B of the disk is designated a reverse rotation, in relation to the actuator head suspension assembly 3. The difference between the forward rotation and the reverse rotation appears mainly in the position of a head on a slider. However, the present invention is applicable to magnetic disk drives of both forward and reverse rotation types.

The actuator head suspension assembly 3 comprises an actuator assembly 31 and a head gimbal assembly (hereinafter referred to as "HGA") 32 so as to be pivotable about a pivot shaft 8. In this embodiment, two HGAs 32 are provided in a sandwiching relation to the magnetic disk 4 so that read and write of data may be done for both surfaces of the magnetic disk 4. The actuator assembly 31 comprises actuator arms 33 for mounting the HGAs 32, a coil support 34 for holding a voice coil (not shown), and a pivot housing which corresponds to a connection between the actuator arms 33 and the coil support 34. To constitute a voice coil motor together with the voice coil, a voice coil yoke 35 is provided on the base 2, and a voice coil magnet (not shown), which is a permanent magnet, is attached to a back side of the voice coil yoke 35.

The HGAs 32 each comprise a load beam and a gimbal assembly which will be described in detail later. A merged lip 36 is formed at a front end of the load beam, and there is realized a so-called load/unload method wherein the merged lip 36 is allowed to slide on a retraction surface of the ramp 5 before stop of rotation of the magnetic disk 4 and the head/slider is retracted from above the surface of the magnetic disk 4. However, the application of the present invention is not limited to the magnetic disk drive of the load/unload type, but the present invention is also applicable to a magnetic disk drive of a contact start/stop type. The merged lips 36, HGAs 32 and actuator arms 33 are formed as a stack structure in a corresponding relation to the recording surfaces of the magnetic disk 4. A relay terminal portion 37 is provided in the actuator assembly 31 to provide connection between a wiring trace 100 connected to the head and a flexible printed circuit board 10 connected to the external terminal 6. The details of the wiring trace 100 and the flexible printed circuit board 10 will be described later.

Figure 2:
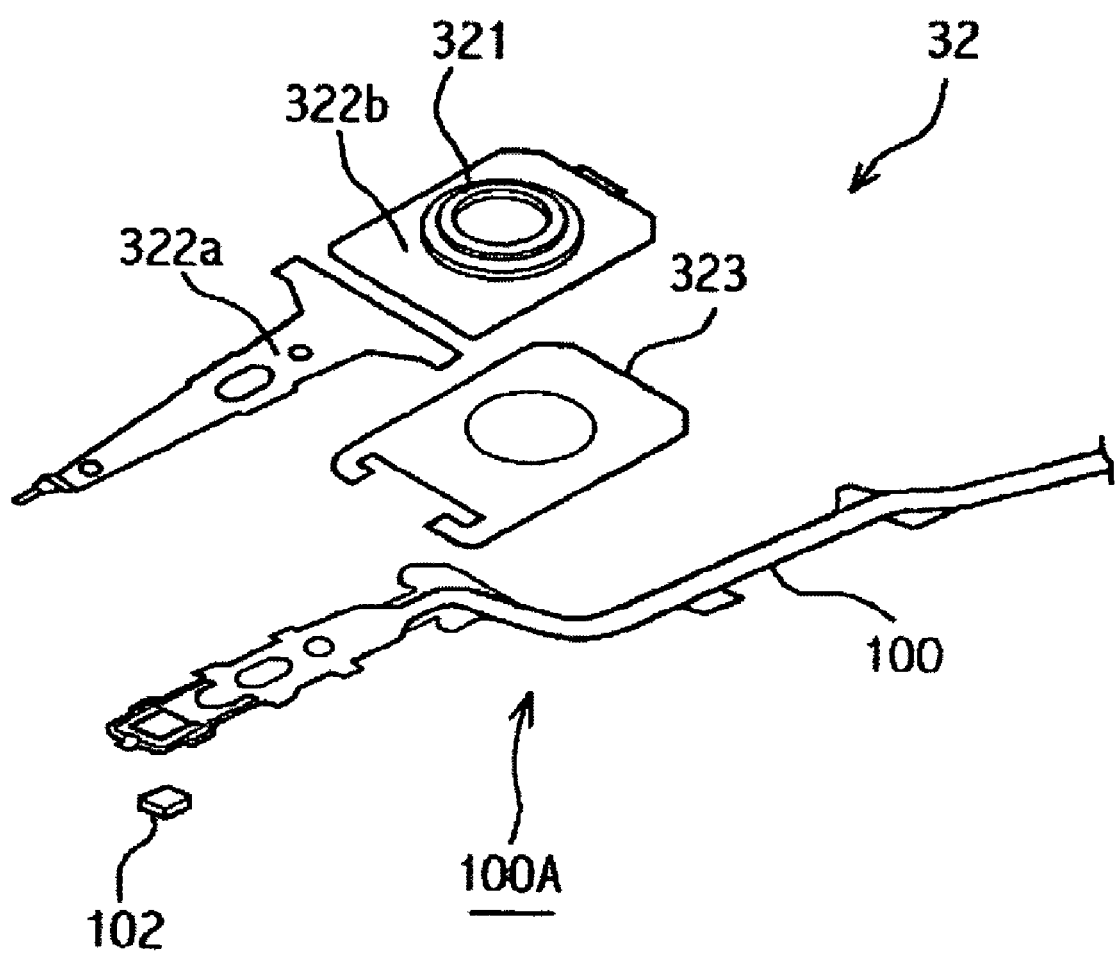
FIG. 2 is a perspective view for explaining the construction of an HGA according to the embodiment.

FIG. 2 is an exploded perspective view illustrating the construction of each HGA 32. Each HGA 32 comprises a mounting plate 321, two pieces of load beams 322a and 322b, a hinge 323, and a gimbal assembly 100A. The load beams need not always be two-piece load beams. A one-piece load beam will do. The gimbal assembly 100A is provided at one end of the wiring trace 100 and adopts a wiring integrated type suspension structure as will be described later. The head/slider, indicated at 102, is attached to a flexure tongue or gimbal tongue (see the reference numeral 103 in FIG. 3) of the gimbal assembly 100A on the side confronting a recording surface of the magnetic disk 4.

In the gimbal assembly 100A, the load beams 322a and 332b are fixed with a hinge 323 and the mounting plate 321 is fixed integrally by spot welding or by use of an adhesive. The mounting plate 321 is swaged to fix the HGA 32 to the actuator arm 33. The load beams 322a and 322b pivot together with the actuator assembly 31 to carry the head/slider 102 up to a predetermined track and provide a pushing load for pushing the head/slider 102 against the opposed surface of the magnetic disk 4. Under a balanced state between a positive pressure as a lifting force which an air bearing surface receives from an air flow and the pushing load induced by the load beam (322a, 322b) the head/slider 102 flies through a predetermined spacing from the surface of the rotating magnetic disk 4.

In the wiring trace 100 of the actuator head suspension assembly 3 thus constructed, the gimbal assembly side as one end is connected (not shown) through a wiring pad to a slider pad formed on the head slider. The opposite end is connected through a multi-connector 100B to the flexible printed circuit board 10, as shown in FIG. 1(B). The wiring trace 100 having the gimbal assembly 100A and the multi-connector 100B is of a construction wherein a conductor layer which constitutes a conductor pattern and an insulating layer which insulates the conductor layer are stacked one on the other A cover layer as a dielectric for the prevention of corrosion is formed on the conductor layer to sandwich the conductor layer in between insulating layers. In the gimbal assembly 100A, moreover, a metal layer as a structure for supporting the head/slider 102 is formed on an insulating layer.

As to the wiring trace 100 having such a stack structure, there are three types which are an additive type, a subtractive type, and a flexible board type, according to different manufacturing methods.

The additive type is a method in which various layers are stacked in order in accordance with the photolithography technique. The subtractive type is a method in which a sheet pre-formed with metal layer, insulating layer, conductor layer, and cover layer, is etched to form a predetermined structure. The flexible board type is a method in which a flexible printed circuit board formed in a predetermined shape by insulating layer, conductor layer, and cover layer, is affixed onto a metal layer. The wiring trace 100 used in this embodiment is the flexible board type, but the gimbal assembly 100A is the additive type.

Figure 3:
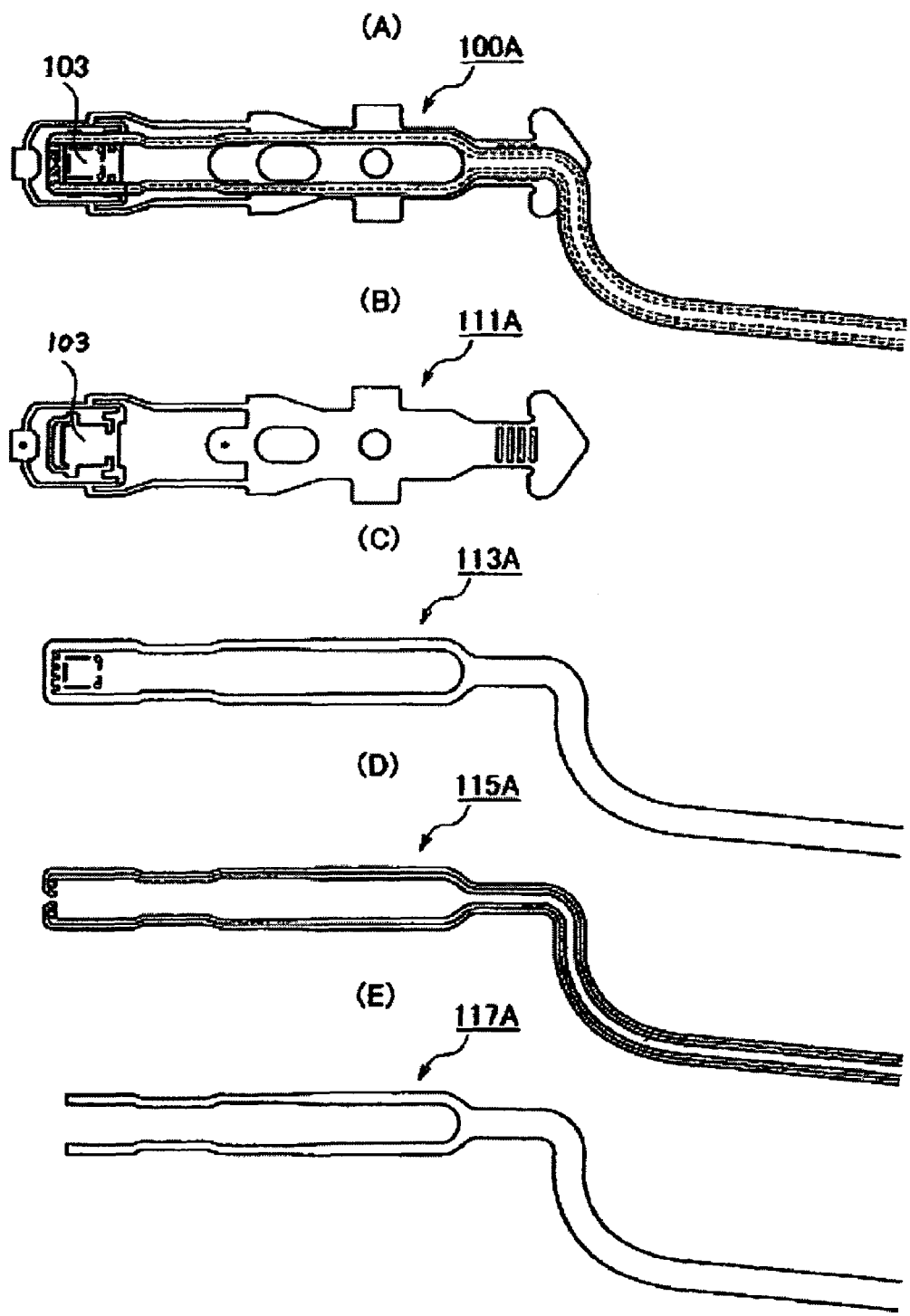
FIG. 3 is a plan view for explaining the structure of a gimbal assembly in a wiring trace according to the embodiment.

FIG. 3 illustrates a stack structure of the gimbal assembly 100A which is a wiring integrated type suspension of the wiring trace 100. As noted above, the gimbal assembly 100A is formed by using a semiconductor processing technique such as a photolithographic etching process or a vapor deposition process. FIG. 3(A) shows the gimbal assembly 100A completed by stacking plural layers, and the structures of the constituent layers of the gimbal assembly 100A are shown in FIGS. 3(B) to 3(E). FIG. 3(A) shows the completed gimbal assembly 100A as seen from the magnetic disk 4 side, in which the head/slider 102 is omitted for simplification of the drawing. FIGS. 3(B) to 3(E) are drawn in the order of stacking toward the magnetic disk surface.

FIG. 3(B) shows a plane of a metal layer 111A, in which as the material of the metal layer there is selected SUS 304 having a sheet thickness of 0.02 mm from among 300 Series stainless steels. The material of the metal layer 111A is not limited to stainless steel, but there also may be selected another hard spring material such as beryllium, copper, or titanium. The metal layer 111A includes a gimbal tongue 103.

FIG. 3(C) shows a plane of an insulating layer 113A which is formed of a polyimide or epoxy resin for insulating the metal layer 111A and conductor layer 115A. The insulating layer 113A is formed on the metal layer 111A in a shape conforming to the pattern of the conductor layer 115A. In this embodiment, the thickness of the insulating layer is set to 0.01 mm. Part of the insulating layer 113A is formed also on the gimbal tongue 103.

FIG. 3(D) shows the conductor layer 115A which is a wiring pattern for the head. In this embodiment, patterning is made by stacking pure copper to a thickness of 0.012 mm. The material of the conductor layer is not limited to copper, but may be another material such as aluminum or silver. FIG. 3(E) shows a pattern of a cover layer 117A which is for protecting a surface of the conductor layer 115A. The cover layer 117A is formed by adhering a polyimide or epoxy layer of about 0.003 mm in thickness onto the conductor layer 115A.

Figure 4:
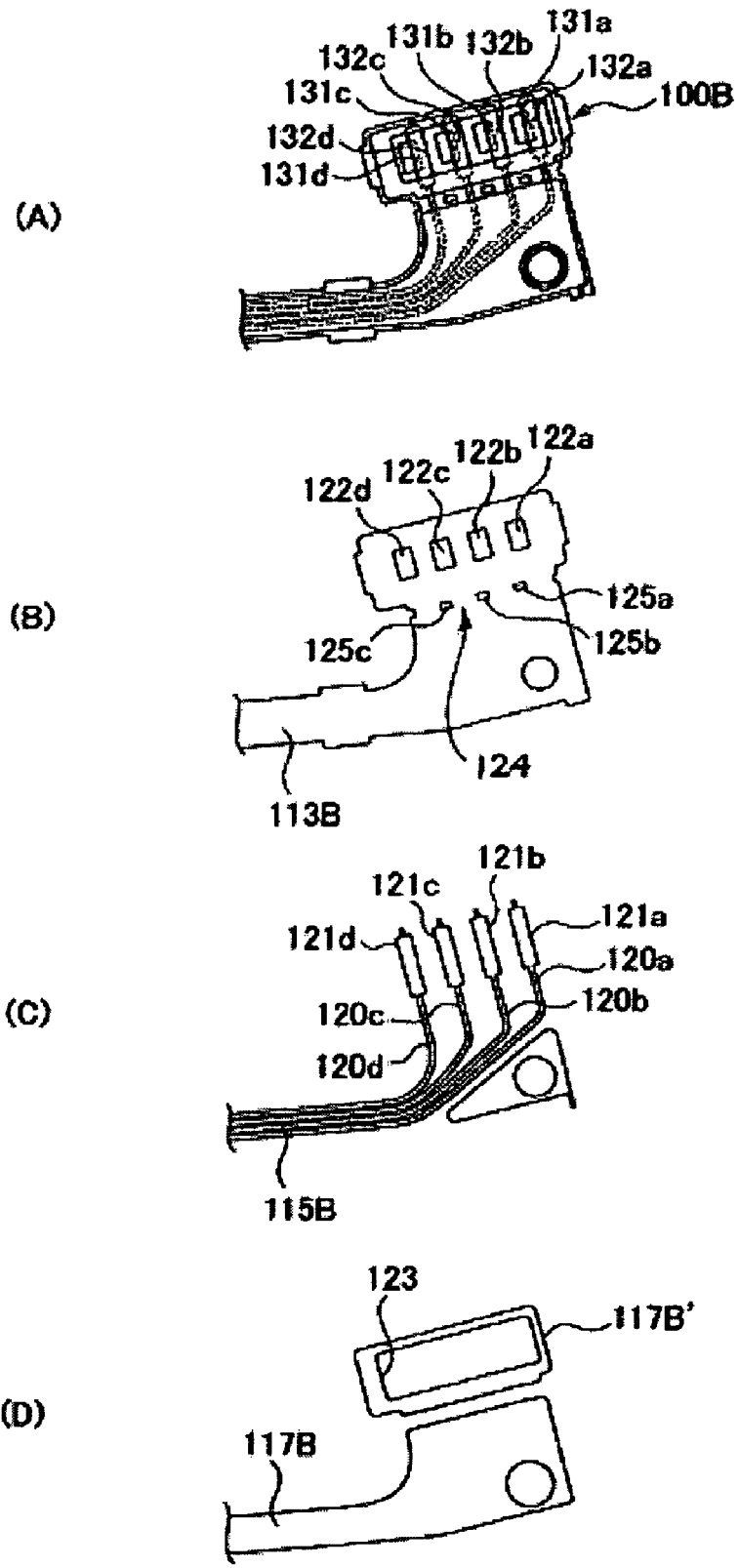
FIG. 4 is a plan view for explaining the structure of a multi-connector in the wiring trace according to the embodiment.

FIG. 4 shows a stack structure of the multi-connector 100B of the wiring trace 100. Like the gimbal assembly 100A, the multi-connector 100B is formed by a semiconductor processing technique such as a photolithographic etching process or a vapor deposition process. The multi-connector 100B completed by stacking plural layers is shown in FIG. 4(A) and structures of constituent layers of the multi-connector 100B are shown in FIGS. 4(B) to 4(D). FIG. 4(A) shows the completed multi-connector 100B as seen from the flexible printed circuit board 10 side. FIGS. 4(B) to 4(D) are drawn in the order of stacking the constituent layers toward the flexible printed circuit board.

FIG. 4(B) shows a plane of the insulating layer 113B formed using a polyimide or epoxy resin for example. The insulating layer 113B is formed in a shape conforming to the pattern of the conductor layer 115B. The conductor layer 115B is stacked on the insulating layer 113B. In this embodiment, the thickness of the insulating layer is set at 0.01 mm.

FIG. 4(C) shows the conductor layer 115B which is a wiring pattern including terminals. In this embodiment, patterning is made by stacking pure copper to a thickness of 0.012 mm. The material of the conductor layer is not limited to copper, but may be another material such as aluminum or silver. FIG. 4(D) shows a pattern of a cover layer 117B for protecting a surface of a conductor layer 115B. The cover layer 117B is formed by adhering a polyimide or epoxy layer of about 0.003 mm in thickness onto the conductor layer 115B. The insulating layer 113B, conductor layer 115B and cover layer 117B, as well as the insulating layer 113A, conductor layer 115A and cover layer 117A of the gimbal assembly 100A, conjointly constitute the wiring trace 100. In both gimbal assembly 100A and multi-connector 100B, the thicknesses of the insulating layer 113B, conductor layer 115B and cover layer 117B, as well as the metal layer 111A, insulating layer 113A, conductor layer 115A, and cover layer 117A, are illustrative and the scope of the present invention is not limited thereto.

In the terminal structure of the multi-connector 100B having stacked insulating layer 113B, conductor layer 115B and cover layer 117B, as shown in FIG. 4, the conductor layer 115B is divided into two pairs, constituting a total of four conductor patterns 120a, 120b, 120c, and 120d as four lead wires. At end portions of the conductor patterns 120a, 120b, 120c, and 120d there are formed terminals 121a, 121b, 121c, and 121d, respectively, in a longitudinal direction of those conductor patterns. The terminals 121a, 121b, 121c, and 121d are formed in a rectangular shape and are spaced at equal intervals so that their short sides are aligned with one another.

Four quadrangular apertures 122a, 122b, 122c, and 122d are formed in the insulating layer 113B of the multi-connector 100B. The terminals 121a, 121b, 121c, and 121d of the conductor patterns 120a, 120b, 120c, and 120d in the conductor layer 115B are respectively provided with exposed portions 131a, 131b, 131c, and 131d exposed from the apertures 122a, 122b, 122c, and 122d in the insulating layer 113B and also provided with lining portions 132a, 132b, 132c, and 132d adjacent to the exposed portions 131a, 131b, 131c, and 131d and bonded to the insulating layer 113B.

Since the lining portions 132a, 132b, 132c, and 132d are areas bonded to the insulating layer 133B and exhibiting an action of strengthening the terminals 121a, 121b, 121c, and 121d, the larger the area thereof, the better. As to the exposed portions 131a, 131b, 131c, and 131d, the larger the area thereof the easier the work, because they are areas to be heated with a soldering iron. On the other hand, it is necessary that the size of each of the terminals 121a, 121b, 121c, and 121d comprising the lining portions 132a, 132b, 132c, 132d and the exposed portions 131a, 131b, 131c, 131d be set within a certain range, taking into account the necessity of ensuring a certain space between adjacent terminals and restrictions on the whole area of the multi-connector 100B. If the area of the lining portions 132a, 132b, 132c, and 132d relative to the total area of the area of the exposed portions 131a, 131b, 131c, 131d and the lining portions 132a, 132b, 132c, 132d is set in the range of 30% to 70%, preferably 40% to 60%, then the area which the exposed portions 131a, 131b, 131c, and 131d require for appropriate soldering and the area which the lining portions 132a, 132b, 132c, and 132d require for strengthening the terminal structure, may be set in a well-balanced manner.

The exposed portions 131a, 131b, 131c, and 131d may be provided throughout the whole of the apertures 122a, 122b, 122c, and 122d. However, if the exposed portions 131a, 131b, 131c, and 131d are provided so as to occupy only part of the areas of the apertures 122a, 122b, 122c, and 122d and allow through apertures to remain in the apertures 122a, 122b, 122c, and 122d, it becomes easier to make a visual alignment at the time of connecting the terminals of the flexible printed circuit board 10 and the terminals 121a, 121b, 121c, 121d, of the conductor patterns 120a, 120b, 120c, 120d, and solder may be allowed to reach back surfaces from surfaces of the exposed portions 131a, 131b, 131c, and 131d, thereby making it possible to enhance the strength of those exposed portions. The areas of the exposed portions 131a, 131b, 131c, and 131d corresponding to surfaces of the terminals 121a, 121b, 121c, and 121d will hereinafter be referred to as "heating surfaces" and the areas of the exposed portions 131a, 131b, 131c, 131d and of the lining portions 132a, 132b, 132c, 132d corresponding to back surfaces of the terminals 121a, 121b, 121c, 121d will hereinafter be referred to as "contact surfaces."

Further, a single rectangular aperture 123 is formed in a cover layer 117B' of the multi-connector 100B in such a manner that the terminals 121a, 121b, 121c, and 121d of the conductor patterns 120a, 120b, 120c, and 120d are exposed except both of their longitudinal end portions. The cover layer 117B' of the multi-connector 100B and the cover layer 117B of the wiring trace 100 are separated in two from each other, centered on a bent portion 124. The bent portion 124 is provided in the insulating layer 113B. Three small apertures 125a, 125b, and 125c are formed in the insulating layer 113B along the long sides of the aperture 123 formed in the cover layer 117B in order to make the multi-connector 100B and the wiring trace 100 easier to be bent along a side face of the flexible printed circuit board 10 at the relay terminal portion 37. By bending the flexible printed circuit board and the wiring trace along the apertures 125a, 125b, and 125c, it becomes easier to align and fix the terminals 121a, 121b, 121c, and 121d of the multi-connector 100B onto terminals 12a, 12b, 12c, and 12d (see FIG. 5) of the flexible printed circuit board 10 at the relay terminal portion 37. The wiring trace 100 is not always required to have the cover layer 117B.

Unlike the four apertures 122a, 122b, 122c, and 122d formed in the insulating layer 113B, the aperture 123 is formed as a single aperture. This is for close contact between the terminals 12a, 12b, 12c, 12d of the flexible printed circuit board 10 and the contact surfaces of the terminals 121a, 121b, 121c, 121d of the multi-connector 100B.

Figure 5:
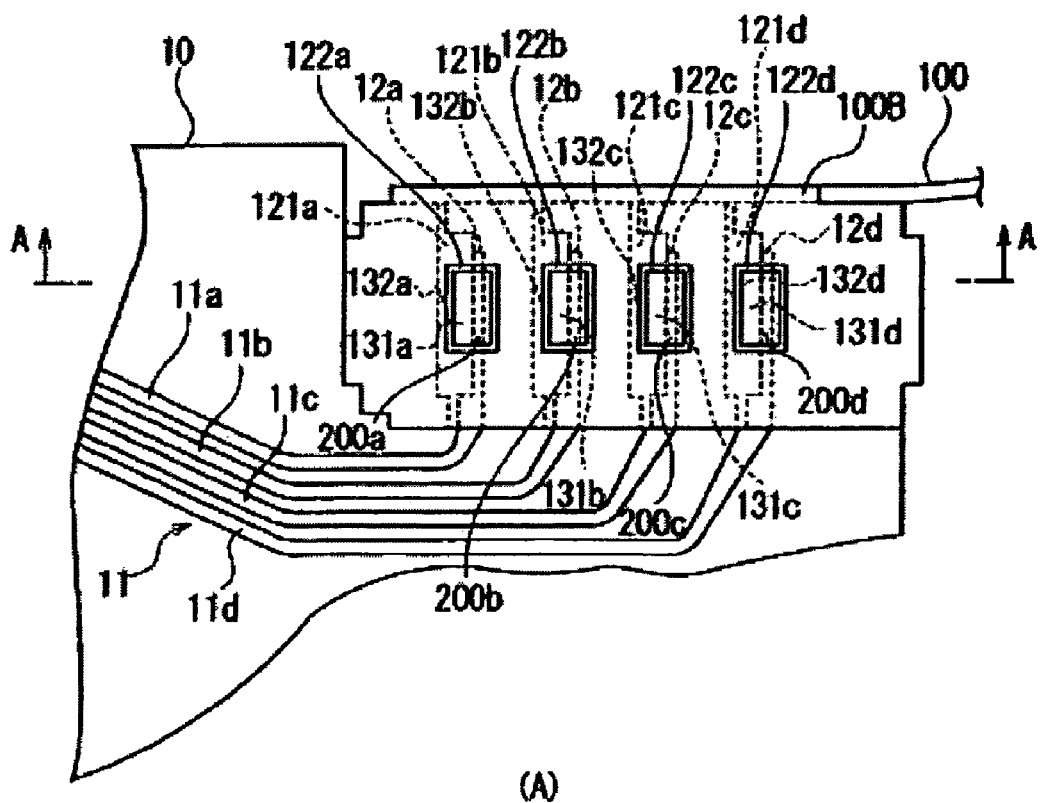
FIG. 5 is a plan view showing a wiring connection structure and a terminal structure of the multi-connector according to the embodiment.
Figure 5:
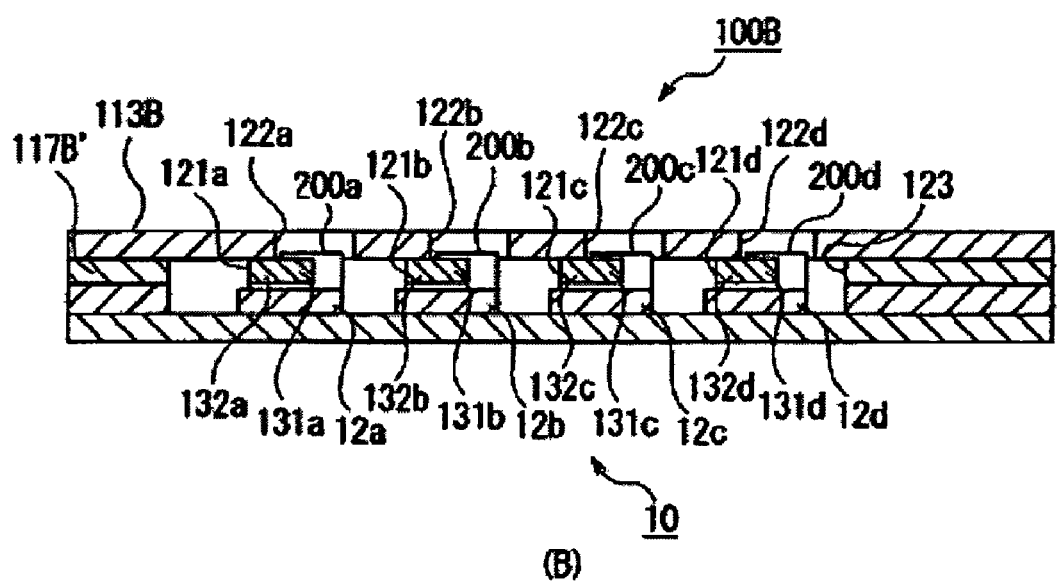

FIG. 5 illustrates the wiring connection structure according to the present invention shown in FIG. 1(B), in which (A) is an enlarged plan view and (B) is a sectional view taken on line A-A in (A). In the flexible printed circuit board 10, a conductor layer 11, which is insulated sandwichingly by flexible sheets, is divided into pairs each for a single head. The conductor layer 11 is composed of conductor patterns 11a, 11b, 11c, and 11d serving as four lead wires as a whole. On the flexible printed circuit board 10, such conductor patterns are formed by the number corresponding to the number of heads. Terminals 12a, 12b, 12c, and 12d, which are exposed in a longitudinal direction of the conductor patterns 11a, 11b, 11c, and 11d, are formed at end portions of those conductor patterns on the side to be soldered to the contact surfaces of the terminals 121a, 121b, 121c, and 121d of the multi-connector 100B. The terminals 12a, 12b, 12c, and 12d are formed in a rectangular shape and are spaced at equal intervals so that their short sides are aligned with one another. Solder bumps are formed on the terminals 12a, 12b, 12c, and 12d of the flexible printed circuit board 10. In FIG. 5, for convenience sake, the conductor patterns 11a, 11b, 11c, and 11d of the flexible printed circuit board 10 are indicated by broken lines at their portions covered with the multi-connector 100B and by solid lines at their uncovered portions.

The terminals 121a, 121b, 121c, and 121d of the multi-connector 100B thus constructed and the terminals 12a, 12b, 12c, and 12d of the flexible printed circuit board 10 are soldered together at the relay terminal portion 37 of the actuator assembly 31. This soldering step will be described below with reference to FIGS. 4 and 5.

First, the actuator head suspension assembly 3, which is assembled in advance, is installed in a working jig (not shown) in such a manner that the relay terminal portion 37 faces up. The portion of the flexible printed circuit board 10 where the terminals 12a, 12b, 12c, and 12d are formed is bonded to the relay terminal portion 37 with use of, for example, a thermosetting adhesive. For example, an epoxy resin is used as the thermosetting adhesive. The wiring trace 100 with the terminals on the gimbal assembly 100A side soldered beforehand to the head/slider 102 of the HGA 32 is disposed along the actuator arm 33. In this state, the wiring trace 100 is hooked to a hook portion (not shown) provided near the relay terminal portion 37 of the actuator arm 33. Then, the wiring trace 100 and the multi-connector 100B are bent along the bent portion 124. More particularly, the cover layer 117B side is bent in a valley shape so that the cover layer 117B side of the multi-connector 100B confronts the terminals 12a, 12b, 12c, and 12d of the flexible printed circuit board 10.

The terminals 121a, 121b, 121c, and 121d of the multi-connector 100B are aligned onto the terminals 12a, 12b, 12c, and 12d of the flexible printed circuit board 10 with use of a tool such as tweezers, and the terminals 121a, 121b, 121c, and 121d are soldered in this order. At this time, the cover layer 117B is positioned between the terminals 12a, 12b, 12c and 12d and the terminals 121a, 121b, 121c, and 121d to form a gap therebetween. However, since the cover layer 117B is about 0.003 mm in thickness and not separated plural apertures, but a single large aperture 123 is formed, the contact surfaces of the terminals may come into close contact with the terminals of the flexible printed circuit board 10.

This soldering step is carried out in the following manner. The heating surfaces of the terminal exposed portions 131a, 131b, 131c, and 131d are heated with a soldering iron (not shown) to melt the solder bumps on the terminals of the flexible printed circuit board 10. At this time, since the apertures formed in the insulating layer 113B extend through the area of the insulating layer 133B adjacent to the exposed portions 131a, 131b, 131c, and 131d to constitute through apertures, solders 200a, 200b, 200c, and 200d connect the heating surfaces and the contact surfaces of the exposed portions 131a, 131b, 131c, and 131d with each other through the through apertures, as shown in FIG. 5. Once the solders 200a, 200b, 200c, and 200d thus connect the heating surfaces and the contact surfaces of the exposed portions 131a, 131b, 131c, and 131d with each other through the through area of the insulating layer 113B, not only the soldered connections are made strong but also the strength of the terminals is enhanced by lapping of the solders 200a, 200b, 200c, and 200d.

While the heating surfaces of the exposed portions 131a, 131b, 131c, and 131d of the terminals are heated with a soldering iron to melt the solder bumps on the terminals of the flexible printed circuit board 10, if the terminals are aligned or displaced by mistake with the soldering iron, the terminals of the multi-connector 100B may be cracked because they are very thin (e.g., 0.012 mm). However, the terminals of the multi-connector 100B are partially bonded as lining portions 132a, 132b, 132c, and 132d to the insulating layer 113B and it is only the exposed portions 131a, 131b, 131c, and 131d that are uncovered (flying leads) over the spaces of the apertures formed in the insulating layer 113B. Therefore, at edges of the apertures, the exposed portions are difficult to be cracked and thus it is possible to strengthen the terminals. Even if the exposed portions are cracked, the cracks do not reach the lining portions 132a, 132b, 132c, and 132d and hence conductivity is ensured. If such a terminal structure is adopted, it becomes no longer necessary to use a preliminary solder so far provided on heating surfaces for lapping of solder between the heating surfaces and contract surfaces in order to strengthen the terminal structure.

Further, in the multi-connector 100B of the wiring trace 100, the insulating layer 113B connects at the foremost end of the multi-connector 100B rather than the lining portions 132a, 132b, 132c, and 132d. In the multi-connector 100B, therefore, the strength of the insulating layer 113B may be enhanced around the apertures 122a, 122b, 122c, and 122d, and it is possible to strengthen the terminals 121a, 121b, 121c, and 121d.

In the multi-connector 100B constructed as above, for example, the terminals 121a, 121b, 121c, and 121d of the conductor patterns 120a, 120b, 120c, and 120d are 0.35 mm in width and 1.4 mm in length. The apertures 122a, 122b, 122c, and 122d formed in the insulating layer 113B of the multi-connector 100B are 0.5 mm wide and 0.7 mm long. Under these dimensional conditions of various portions, the width of each of the apertures 122a, 122b, 122c, and 122d formed through the area of the insulating layer 113B adjacent to the exposed portions 131a, 131b, 131c, and 131d is set at 0.3 mm.

According to the above embodiment, in the terminals 121a, 121b, 121c, and 121d of the conductor patterns 120a, 120b, 120c, and 120d in the multi-connector 100B, the lining portions 132a, 132b, 132c, and 132d are provided on one sides of the exposed portions 131a, 131b, 131c, and 131d. But this constitutes no limitation and those lining portions may be provided on both sides of the exposed portions 131a, 131b, 131c, and 131d.

Figure 6:
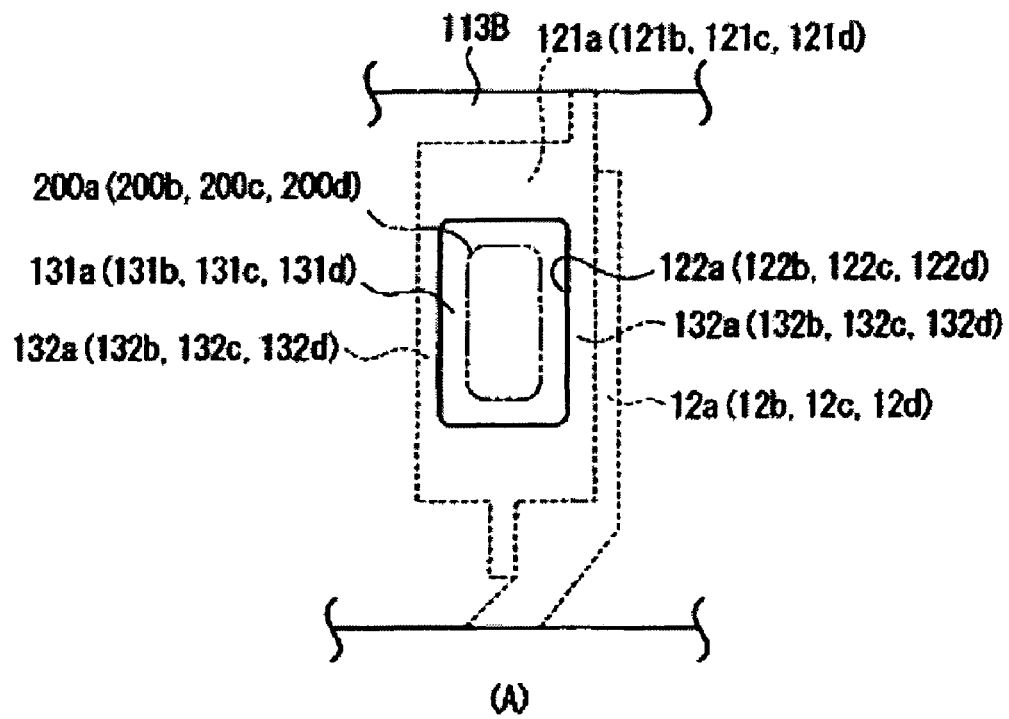
FIG. 6 is a plan view for explaining a wiring connection structure and a terminal structure of a multi-connector according to another embodiment of the present invention.
Figure 6:
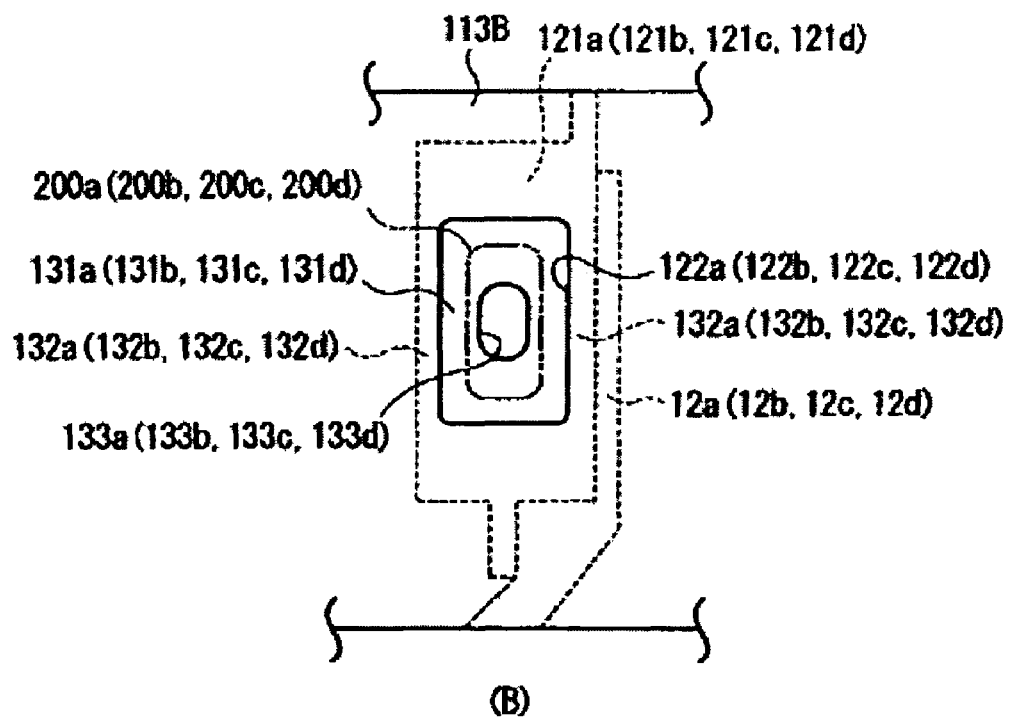
Figure 7:
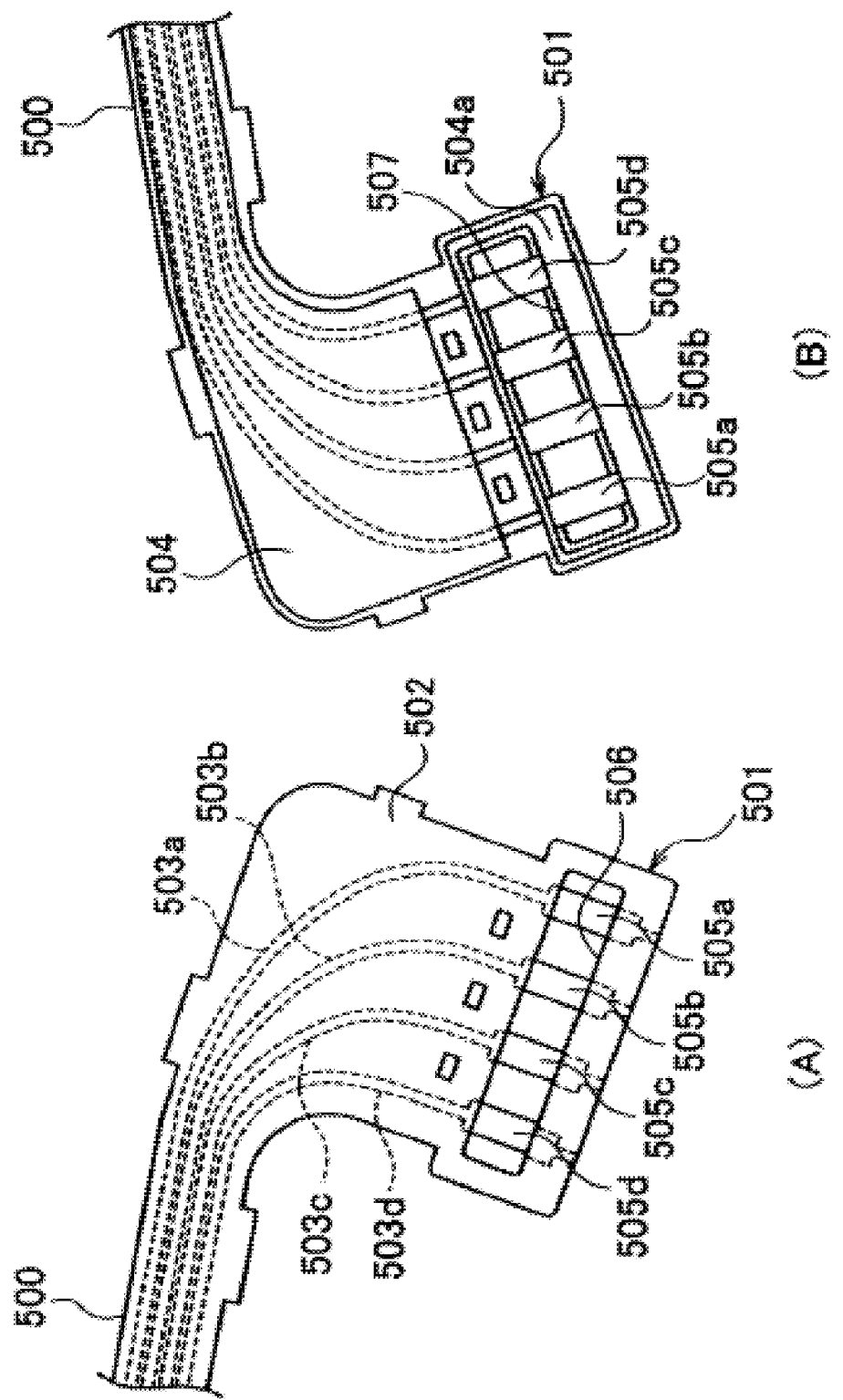
FIG. 7 is a plan view showing a terminal structure of a conventional multi-connector.
Figure 8:
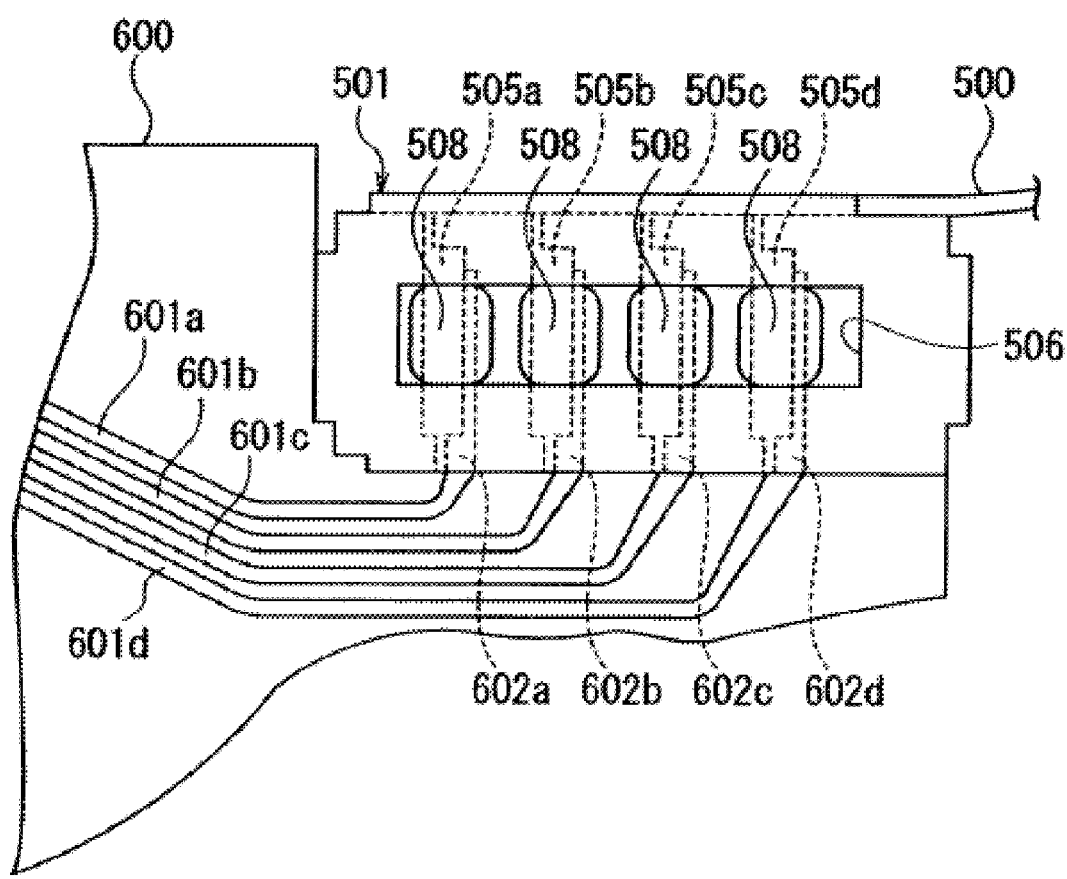
FIG. 8 is a plan view showing a wiring connection structure and the terminal structure of the conventional multi-connector.

FIG. 6 shows another embodiment of the present invention in connection with the exposed portions 131a, 131b, 131c, 131d and the lining portions 132a, 132b, 132c, 132d in the multi-connector 100B. As shown in FIG. 6(A), also in the case where the lining portions 132a, 132b, 132c, and 132d are provided on both sides of the exposed portions 131a, 131b, 131c, and 131d, since both sides of the exposed portions 131a, 131b, 131c, and 131d are bonded as lining portions 132a, 132b, 132c, and 132d to the insulating layer 113B, the terminals of the multi-connector are difficult to be cracked and it is possible to strengthen the terminals. Even if the exposed portions are cracked, the cracks do not reach the lining portions 132a, 132b, 132c, and 132d which are bonded to the insulating layer 113B, so that conductivity is ensured. Such through apertures 133a, 133b, 133c, and 133d as shown in FIG. 6(B) may be formed in the exposed portions 131a, 131b, 131c, and 131d with lining portions 132a, 132b, 132c, and 132d formed on both sides thereof. By forming the through apertures 133a, 133b, 133c, and 133d in the exposed portions 131a, 131b, 131c, and 131d, it becomes easier to make a visual alignment of terminals. In addition, the solder used in soldering may connect the heating surfaces and the contact surfaces of the exposed portions 131a, 131b, 131c, and 131d with each other and thus the solder connection becomes stronger. The through apertures 133a, 133b, 133c, and 133d may take any of various shapes including circular and quadrangular shapes insofar as the solder may connect the heating surfaces and the contact surfaces of the exposed portions 131a, 131b, 131c, and 131d with each other through the through apertures 133a, 133b, 133c, and 133d.

Although in the above embodiment the heating surfaces of the exposed portions 131a, 131b, 131c, and 131d of the exposed portions are heated with a soldering iron to melt the solder bumps on the terminals of the flexible printed circuit board 10, thereby soldering the multi-connector 100B and the flexible printed circuit 10 with each other, this constitutes no limitation and thread-like solder or the like may be used. In this case, thread-like solder is melted and placed onto the exposed portions 131a, 131b, 131c, and 131d. If the area of the insulating layer 133B adjacent to the exposed portions 131a, 131b, 131c, and 131d is a through area, the solder used in soldering may connect the heating surfaces and the contact surfaces of the exposed portions 131a, 131b, 131c, and 131d with each other. Even if such through apertures 133a, 133b, 133c, and 133d as shown in FIG. 6(B) are formed in the exposed portions 131a, 131b, 131c, and 131d, the solder used in soldering may connect the heating surfaces and the contact surfaces of the exposed portions 131a, 131b, 131c, and 131d with each other.

Although in the above embodiment the terminals of conductor patterns and the apertures of the insulating layer 133B and of the cover layer 117B in the multi-connector 100B are all formed rectangularly, no limitation is made thereto and they may be in any other shape insofar as the exposed portions are exposed from the apertures of the insulating layer 113B, the lining portions are bonded to the insulating layer 113B and the terminals of the multi-connector 100B and the terminals of the flexible printed circuit board 10 may be soldered to each other.

Although in the above embodiment the multi-connector 100B is provided at an end of the wiring trace 100, no limitation is made thereto, and the multi-connector 100B may be provided at a certain intermediate position of the wiring trace 100.

Although in the above embodiment the terminals of the multi-connector 100B and the terminals of the flexible printed circuit board 10 are soldered to each other, no limitation is made thereto and both may be connected by ultrasonic bonding. In ultrasonic bonding there is used a bonding tool which comes into contact with an object to be bonded and which imparts an ultrasonic oscillation to the object. More specifically, the tip of a bonding tool used in place of the soldering iron is put in contact with a terminal of the multi-connector 100B which is superimposed on a terminal of the flexible printed circuit board 10, under a predetermined pressure, and produces an ultrasonic oscillation between both terminals. With a friction induced between both terminals by the oscillation, an oxide layer on the contacted surface is removed, a local temperature rise is added, and a bonding force is created between atoms of the bonded metals. Thus the terminal of the multi-connector 100B and that of the flexible printed circuit board 10 are bonded together. The terminal structure described in this embodiment is difficult to be cracked even under oscillation and the force applied by the bonding tool and is thus also suitable for ultrasonic bonding.

It is to be understood that the above description is intended to be illustrative and not restrictive. Many embodiments will be apparent to those of skill in the art upon reviewing the above description. The scope of the invention should, therefore, be determined not with reference to the above description, but instead should be determined with reference to the appended claims alone with their full scope of equivalents.

What is claimed is:

1. A terminal structure formed in a wiring trace including an insulating layer and a conductor pattern formed on a surface of the insulating layer, the conductor pattern comprising:
    an exposed portion exposed from an aperture formed in part of the insulating layer; and
    a lining portion adjacent to the exposed portion in a transverse direction and a longitudinal direction of the conductor pattern and bonded to the insulating layer, such that the exposed portion is less than the full width of the conductor pattern in the transverse direction.

2. A terminal structure according to claim 1, wherein the aperture is formed through an area of the insulating layer adjacent to the exposed portion in the longitudinal direction of the conductor pattern.

3. A terminal structure according to claim 1, wherein the area of the lining portion relative to the total area of the area of the exposed portion and the area of the lining portion is in the range of 30% to 70%.

4. A terminal structure according to claim 1, wherein the lining portion is provided on both sides of the exposed portion in the longitudinal direction of the conductor pattern.

5. A terminal structure according to claim 4, wherein a through aperture is formed in the exposed portion.

6. A terminal structure according to claim 1, wherein the conductor pattern includes a first conductor pattern provided with the exposed portion and the lining portion and a second conductor pattern provided with the exposed portion and the lining portion, and the portions of the insulating layer corresponding to the lining portion of the first conductor pattern and the lining portion of the second conductor pattern are connected together on an end side of the wiring trace rather than the lining portions.

7. A terminal structure according to claim 6, wherein the wiring trace has a second insulating layer formed on the conductor pattern formed on the surface of the insulating layer, and an aperture for exposure of the exposed portions is formed in the second insulating layer.

8. A terminal structure according to claim 7, wherein the wiring trace has a bent portion, and on the end side rather than the bent portion the exposed portion of the first conductor pattern and the exposed portion of the second conductor pattern are exposed from the aperture as a single aperture formed in the second insulating layer.

9. A terminal structure according to claim 8, wherein the second insulating layer is divided in two with the bent portion disposed therebetween.

10. A wiring connection structure connecting a flexible printed circuit board and a wiring trace with each other, the flexible printed circuit board including terminals, the wiring trace including an insulating layer and a conductor pattern formed on a surface of the insulating layer,
wherein the conductor pattern includes an exposed portion exposed from an aperture formed in part of the insulating layer and a lining portion bonded to the insulating layer in adjacency to the exposed portion in a transverse direction and a longitudinal direction of the conductor pattern, and the terminals of the flexible printed circuit board and the exposed portion of the conductor pattern are connected to each other, such that the exposed portion is less than the full width of the conductor pattern in the transverse direction.

11. A wiring connection structure according to claim 10, wherein the flexible printed circuit board and the wiring trace are connected by melting of solder bumps formed on the terminals of the printed circuit board.

12. A wiring connection structure according to claim 11, wherein the aperture is formed through an area of the insulating layer adjacent to the exposed portion in the longitudinal direction of the conductor pattern, and the solder used in the soldering connects a heating surface and a contact surface of the exposed portion with each other through the through area of the insulating layer.

13. A wiring connection structure according to claim 12, wherein the exposed portion includes a through aperture, and the solder used in the soldering connects the heating surface and the contact surface of the exposed portion with each other through the through aperture of the exposed portion.

14. A wiring connection structure according to claim 10, wherein the terminals of the flexible printed circuit board and the exposed portion of the conductor pattern are connected together using ultrasonic waves or by soldering.

15. A wiring connection structure according to claim 10, wherein a multi-connector including plural the conductor patterns and plural the exposed portions and the lining portions of the conductor patterns is provided on an end side of the wiring trace connected to the flexible printed circuit board.

* * * * *